(12) United States Patent
Ramesh et al.

(10) Patent No.: US 6,275,538 B1
(45) Date of Patent: Aug. 14, 2001

(54) TECHNIQUE FOR FINDING A STARTING STATE FOR A CONVOLUTIONAL FEEDBACK ENCODER

(75) Inventors: Rajaram Ramesh, Cary; Havish Koorapaty, Raleigh; Yi-Pin Wang, Cary, all of NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/041,115

(22) Filed: Mar. 11, 1998

(51) Int. Cl.[7] ............................... H04L 5/12; H04L 23/02
(52) U.S. Cl. ........................................... 375/265; 714/786
(58) Field of Search ................................... 375/377, 265, 375/295; 714/752, 786; 341/51, 173, 899

(56) References Cited

U.S. PATENT DOCUMENTS

| | | | |
|---|---|---|---|
| 4,520,490 | * | 5/1985 | Wei . |
| 5,327,441 | * | 7/1994 | Kawazoe et al. . |
| 5,331,665 | * | 7/1994 | Busschaert et al. . |
| 5,349,589 | * | 9/1994 | Chennakeshu et al. . |
| 5,721,745 | * | 2/1998 | Hladik et al. . |
| 5,982,818 | * | 11/1999 | Krueger et al. ................. 375/265 |
| 6,023,783 | * | 2/2000 | Divsalar et al. ................. 714/792 |

OTHER PUBLICATIONS

Cox, Richard V. and Sundberg, Carl–Erik W.; "An Efficient Adaptive Circular Viterbi Algorithm for Decoding Generalized Tailbiting Convolutional Codes"; IEEE Transactions on Vehicular Technology, Feb. 1994, No. 1, pp. 57–68.

Joerssen, O. and Meyr, H.; "Terminating the Trellis of Turbo–Codes"; Electronic Letters, Aug. 4, 1994, vol. 30, No. 16, pp. 1285–1286.

* cited by examiner

*Primary Examiner*—Chi Pham
*Assistant Examiner*—Jean B. Corrielus
(74) *Attorney, Agent, or Firm*—Coats & Bennett, PLLC

(57) ABSTRACT

A convolutional feedback encoder uses a shift type shift register with both feed-forward and feedback circuit structures to process and encode a fixed length information sequence. The encoder is configured, through careful selection of the feedback coefficients, so as to achieve a tail-biting mode of operation. Tail-biting means that the state of the encoder prior to the input of the first uncoded data bit is the same as the state of the encoder upon input of the last uncoded data bit. The starting state of the encoder is found by linearly combining data bits in the information sequence. The linear combinations are determined by a selection matrix or selection vector which is derived from the feedback coefficients of the encoder.

17 Claims, 3 Drawing Sheets

TECHNIQUE FOR FINDING A STARTING STATE FOR A CONVOLUTIONAL FEEDBACK ENCODER

FIELD OF THE INVENTION

This invention relates to the encoding of data for transmission through digital radio communication channels and more specifically to convolutional feedback encoders.

BACKGROUND OF THE INVENTION

The ultimate purpose of a communication system is to transmit information from an information source to a destination over a communication channel. A communication channel is any medium over which information can be transmitted. In many types of communication channels, such as radio communication channels, noise is inherent. The inherent noise causes errors to occur in the information transmitted over the communication channel. In order to combat the noisy channel, and hence reduce bit errors, digital cellular radio systems typically employ both error-detecting and error-correcting codes. These error control techniques introduce controlled redundancy into the information transmitted over the communication channel which can be used at the destination to detect and possibly correct errors in the channel corrupted signal.

One well-known technique for error-correction uses convolutional codes as described by Andrew Viterbi and Jim Omura in their publication Principles of Digital Communication and Coding published by McGraw-Hill, Inc., New York, N.Y. 1979. With convolutional encoding, information bits are encoded and decoded in such a way as to estimate bits that were corrupted in transmission. Convolutional codes are typically described by the rate of the code, its constraint length, and the parity equations.

In a convolutional code having a rate of k/n, n output bits are produced for each set of k information bits. During each coding interval, k information bits are shifted into the shift register and n bits (where n>k) are produced at the output of the shift register. The redundancy bits are combinations (linear algebraic functions) of the contents of the shift register and the most recent input bit, with the specific combinatorial function depending on the convolutional code implemented. The state of the encoder at a given time is defined as the contents of the shift register. In practice, such convolutional codes may be divided into two classes: recursive and non-recursive codes. The implementation of non-recursive codes typically involves the incorporation of a feed-forward type shift register, while recursive codes generally require an encoder with a feedback circuit.

Tail bits and tail-biting are commonly used methods to terminate the trellises or coding paths, of convolutional codes for short block lengths. When tail-bits are used, the encoder is forced to a known state at the end of the block. Tail-biting constrains the encoder to begin and end at the same state, which necessarily depends on the data sequence being transmitted.

For the feed-forward or non-recursive case, it is relatively easy to find the initial state of the encoder which satisfies the tail-biting requirement. In practice, the feed-forward shift register is simply initialized with the last m bits of the input sequence, where m is the memory of the code. However, in the case of recursive codes, it is not as easy to find the initial state of the encoder which satisfies the tail-biting requirement. This is primarily the result of the feedback nature of the recursive encoder.

Therefore, there is and continues to be a need for a practical and efficient technique for determining the initial or starting state of a recursive convolutional feedback encoder to enable the use of tail-biting codes.

SUMMARY OF THE INVENTION

The present invention is a convolutional feedback encoder for encoding short information sequences. The encoder comprises a shift register with a feedback circuit and an output circuit. During each coding interval, k bits from the information sequence are input to the encoder and n coded output bits are generated. Before encoding begins, the encoder is initialized to a starting state selected so that the ending state will be the same as the starting state. Thus, the present invention implements a recursive, tail-biting code.

The present invention employs an input buffer and logic circuit to initialize the convolutional feedback encoder before encoding of the information sequence begins. The information sequence is stored temporarily in an input buffer before it is passed to the convolutional feedback encoder. A logic circuit is connected between the input buffer and the convolutional feedback encoder. The logic circuit forms linear combinations of the input bits in the information sequence. Each linear combination represents one element in the shift register of the convolutional feedback encoder.

DETAILED DESCRIPTION OF THE INVENTION

Figure 1:
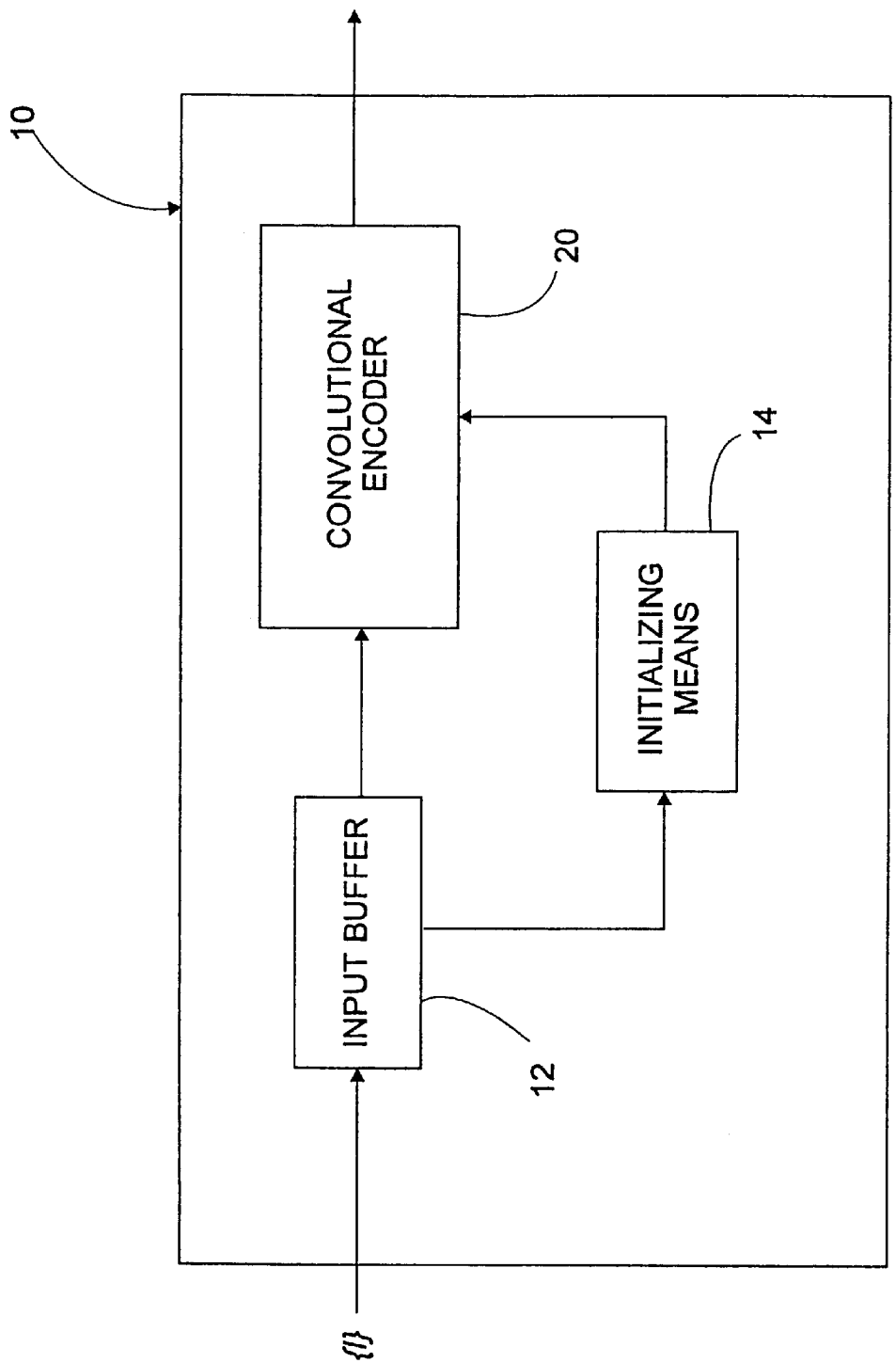
FIG. 1 is a schematic illustration of an encoding apparatus which implements a recursive, tail-biting convolutional code.

Shown in FIG. 1 is a schematic diagram of an encoding apparatus generally indicated by the numeral 10. Encoding apparatus 10 is adapted to receive an uncoded, information sequence {I} comprising a plurality of input bits and produce a coded output. Encoding apparatus 10 generally includes an input buffer 12, a convolutional feedback encoder 20, and an initializing means 14 connected between the input buffer 12 and encoder 20. The input buffer 12 receives the entire information sequence {I} before passing the information sequence {I} to the convolutional feedback encoder 20. The convolutional feedback encoder 20 receives the information sequence {I} from the input buffer 12 after the convolutional feedback encoder 20 has been initialized to a predetermined starting state. The initializing means 14 determines the starting state of the encoder 20 based upon the data in the input buffer 12 and initializes the convolutional feedback encoder 20 before coding of the information sequence {I} begins. The starting state is chosen so that the encoder 20 will begin and end in the same state. Thus the encoder 10 of the present invention implements what is known as a tail-biting code.

Figure 2:
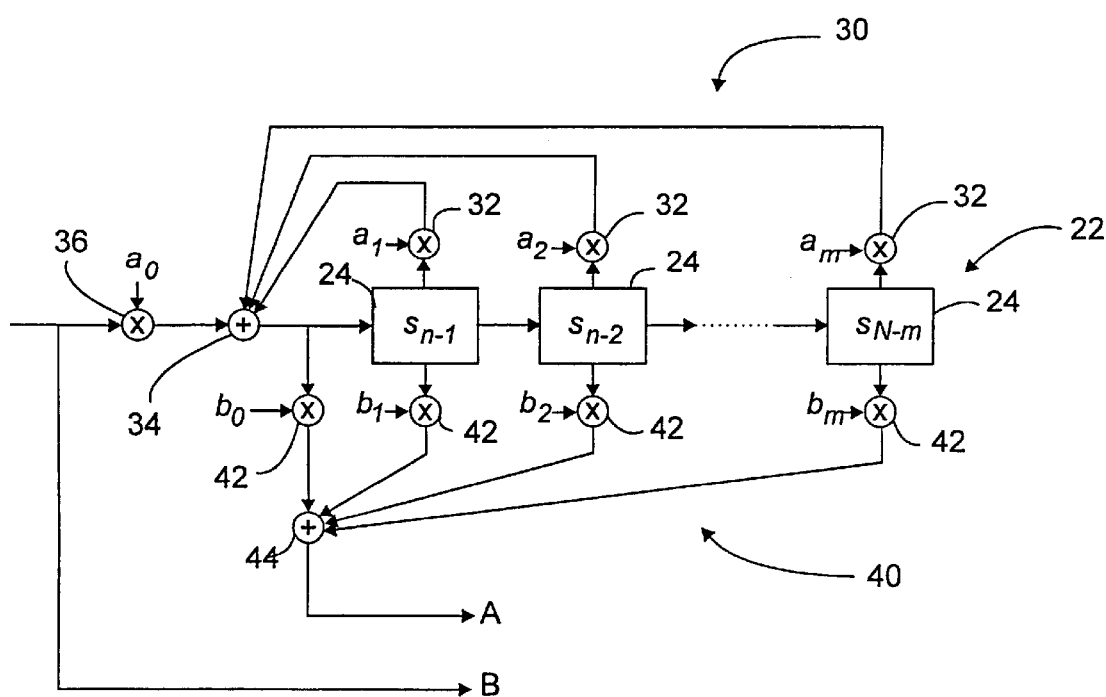
FIG. 2 is a schematic illustration of a convolutional feedback encoder used in the present invention.

Referring now to FIG. 2, the convolutional feedback encoder 20 is shown in more detail. The encoder 20 shown in FIG. 2 is a rate ½ encoder. It should be appreciated, however, that encoders 20 of different rates could also be used to practice the present invention. Convolutional feedback encoder 20 comprises, in part, a shift register 22, which includes a series of shift register elements 24. The individual elements 24 comprising shift register 22, are coupled in a manner such that the contents of the register 22 may be sequentially passed or shifted serially from the first element 24 towards last element 24 of the shift register 22.

Encoder 20 further comprises a feedback circuit, indicated generally by the numeral 30. Feedback circuit 30 includes a series of feedback product nodes 32. Each feedback product node 32 has an associated feedback coefficient denoted $a_1, a_2, \ldots, a_{m-1}$. There is a separate feedback product node 32 associated with each element 24 of the shift register 22. The feedback product nodes 32 multiply the contents of the associated shift register elements 24 by the feedback coefficient. The outputs of all of the feedback product nodes 32 are coupled to a feedback summation node 34 located at the front end of the shift register 22. The feedback summation node 34 also receives input from an input product node 36 whose coefficient is denoted $a_0$. In the embodiment shown, the coefficient $a_0=1$. For purposes of this application, the coefficients $a_0, a_1, a_2, \ldots, a_{m-1}$ will be referred to as the feedback coefficients. The input product node 36 is not associated with a specific shift register element 24, but instead takes as input the incoming uncoded bit 14 from the input buffer 12. As shown in FIG. 1, the output of the feedback summation node 34 is then provided as an input to the first element 24 of the shift register 22, hence the recursive nature of the convolutional feedback encoder 20.

The convolutional feedback encoder 20 further includes an output circuit, generally indicated by the numeral 40. Output circuit 40 includes a series of feed-forward product nodes 42. . Each feed-forward product node 34 has an associated feed-forward coefficient denoted $b_0, b_1, \ldots, b_k$. There is a separate feed-forward product node 32 associated with each element 24 of the shift register 22. It should also be noted that the first feed-forward product node 42, is not associated with a specific shift register element 24, but instead takes input directly from the output of the feedback summation node 34. The outputs of all of the feed-forward product nodes 42 are further coupled to a feed-forward summation node 44, with the output of this summation node 44 forming a first output bit A. A second output 50 is connected directly to the input of the encoder 20 which produces a second output bit B. Thus, for each bit input to the encoder 20, two coded output bits A and B are generated. These output bits A and B are sampled during each coding interval to generate a coded output.

In the particular embodiment considered and described herein, both the feedback and feed-forward coefficients are assigned binary values (0 or 1). However, those skilled in the art will readily appreciate that the encoding apparatus 10 of the present invention is not restricted to the use of binary tap coefficients and, in fact, can be made to operate in a functionally similar manner using coefficients from any multi-level alphabet or finite field for the feedback and feed-forward taps. Given the binary nature of the shift register contents and the coefficients of the present embodiment, it should be appreciated that both the feedback and feed-forward summation nodes 34 and 44, respectively, operate on the principle of modulo 2 arithmetic. In general, the application of modulo 2 arithmetic to a binary system leads to the following generalized summation rules which apply to both summation nodes 34 and 44: summation of all zeros equals zero, summation of an even number of ones equals zero, and summation of an odd number of ones equals one.

The binary nature of the feedback coefficients serves to effectively gate the contents of their associated register element 24. That is, with regard to the product nodes 32 and 42, a coefficient value of "1" multiplied by the contents of an associated register element 24 results in a product node output value which is equal to the contents of the register element 24, while a coefficient value of "0" results in a product node output value which is always equal to zero, regardless of the contents of the associated register element 24.

In operation, bits in the information sequence {I} are shifted into the convolutional encoder 20 one bit at a time. After entering in each bit, the outputs A and B are sampled in succession to produce two output bits. At this point, it should be appreciated that the use of tail-biting schemes with convolutional feedback encoders of the type contemplated herein necessarily requires that the shift register 22 be initialized prior to the input of the first uncoded bit. The initial state is chosen so that the final state of the encoder 20 will the same as the starting state.

As encoding begins, the first input bit is presented to the summation node 34 at the input of the encoding apparatus 10. The remaining inputs to the summation node 34 are fed back from respective elements 24 of the shift register 22. More particularly, the remaining four inputs to the summation node 34 are the outputs of each of the feedback product nodes 32 associated with the m elements of the shift register 22. Thus, the output of the convolutional feedback encoder 20 corresponding to the input bit depends upon this input bit and the bits stored in the shift register 22. The shift register 22 may be thought of as existing in one of $2^m$ possible states where m is the number of elements 24 in the shift register 22. The output of the encoder 20 will depend on this state, and on the value of the incoming bit. When the outputs A and B have been sampled, the output of the summation node 34 is shifted into the register 22 replacing the bit in the first element of the register 22. The contents of the shift register 22 are shifted to the right one position. The bit in the last element of the shift register 22 is effectively pushed out of the register 22. Thus, the state of the encoder 20 will change during each coding interval. The process or operation described above is repeated or executed for each incoming bit in the information sequence {I}. After the final bit is input, the shift register 22 will return to its starting state.

Given the basic operational discussion of the tail-biting, recursive convolutional encoding apparatus 10 provided above, attention is now turned to the significant and non-trivial task of determining the correct initial state of the encoder 20. For feed-forward or non-recursive type encoders, it is relatively easy to find the initial state of the encoder 20 which satisfies the tail-biting requirement. In practice, the feed-forward shift register 22 is simply initialized with the last m bits of the information sequence {I}, where m is the memory of the code. However, in the case of recursive encoders such as that described above, it is not as easy to find the initial state of the encoder which satisfies the tail-biting requirement.

To understand the present invention, the operation of the convolutional feedback encoder 20 will be described in mathematical terms. This mathematical model will then be used to explain the technique used by the present invention for finding the initial state of the encoder 20.

The state of the encoder 20 at time n−1 is denoted as $S_{n-1}$, which is defined as the state of the shift register 22 at time n−1 (i.e., the starting state). Thus, $$S_{n-1} = \{s_{n-1}, s_{n-2}, \ldots, s_{n-m}\} \qquad \text{Eq. (1)}$$

and, $$S_n = \{s_n, s_{n-1}, \ldots, s_{n-m+1}\} \qquad \text{Eq. (2)}$$

where $s_n$ is given by $$s_n = a_0 d_n + a_1 s_{n-1} + a_2 s_{n-2} + \ldots + a_m s_{n-m} \quad \text{Eq. (3)}$$

It should be noted that the + sign in Equation (3) represents addition modulo 2 and $d_n$ represents the incoming bit. For a tail-biting code to exist, the starting state and the ending state of the encoder 20 must be equal. If the input sequence is N blocks long and the starting time is n=0, then the ending state is $\{s_{n-1}, s_{n-2}, s_{n-m+1}\}$. This condition can be expressed as follows:

$$s_{-1} = s_{N-1}, s_{-2} = s_{N-2}, s_{-3} = s_{N-3}, \ldots, s_{-m} = s_{N-m} \quad \text{Eq. (4)}$$

Given the variables or terms described above, the relationship between the starting state of the encoder 20 and the information sequence $\{I\}$ can be expressed as a system of linearly independent equations as follows:

$$d_0 = a_0 s_0 + a_1 s_{N-1} + a_2 s_{N-2} + \ldots + a_m s_{N-m} \quad \text{Eq. (5)}$$

$$d_1 = a_0 s_1 + a_1 s_0 + a_2 s_{N-1} + \ldots + a_m s_{N-k+m} \quad \text{Eq. (6)}$$

$$\ldots \quad \text{Eq. (7)}$$

$$d_{N-1} = a_0 s_{N-1} + a_1 s_{N-2} + a_2 s_{N-3} + \ldots + a_m s_{N-1} \quad \text{Eq. (8)}$$

where m is the memory of the code, $d_n$ is a bit in the information sequence $\{I\}$, and N is the length of or number of bits in the information sequences. Expressed in matrix form, Equations (5)–(8) becomes:

$$\begin{bmatrix} a_0 & a_1 & \ldots & a_m & 0 & 0 & \ldots & 0 \\ 0 & a_0 & \ldots & a_{m-1} & a_k & 0 & \ldots & 0 \\ \vdots & \vdots & & \vdots & \vdots & \vdots & & \vdots \\ a_1 & a_2 & \ldots & 0 & 0 & 0 & 0 & a_0 \end{bmatrix} \begin{bmatrix} s_{N-1} \\ s_{N-2} \\ \vdots \\ s_0 \end{bmatrix} = \begin{bmatrix} d_{N-1} \\ d_{N-2} \\ \vdots \\ d_0 \end{bmatrix} \quad \text{Eq. (9)}$$

In other words, $$As = d \quad \text{Eq. (10)}$$

In Equation (10), capital letters denote a matrix and lower case letters denote vector quantities.

It should be noted that the first row in matrix A is given by the feedback coefficients of the convolutional feedback encoder 20 and each subsequent row is a circular shift of the previous row. Row 0 (i.e., the first row) can be written in polynomial form as $$a(x) = a_0 + a_1 x + a_2 x^2 + \ldots a_m x^m \quad \text{Eq. (11)}$$

Row 1 can be written in polynomial form as:

$$x' a(x) \bmod (1 + x^N) \quad \text{Eq. (12)}$$

A linear combination of rows can be written as:

$$\Sigma g_l x' a(x) \bmod (1 + X^N) = g(x) a(x) \bmod (1 + X^N) \quad \text{Eq. (13)}$$

where g(x) has a degree less than N. Note that each $g_l$ in g(x) has a value of "0" or "1". A value of "1" means that the corresponding row is included in the linear combination. A value of "0" means that the corresponding row is excluded.

The elements vector s in the above described model of the convolutional feedback encoder 20 represent elements of the state of the encoder 20 at various times. Each element of the vector s represents the state of one element in the shift register 22 at different time instants. The vector d represents the information sequence $\{I\}$ which is to be encoded, that is, each element of the vector d represents a bit in the information sequence $\{I\}$. As mentioned previously, it should be further appreciated that a mathematically meaningful solution to the set of simultaneous equations represented by Equation (9) can be obtained only if the system of equations is linearly independent. A detailed explanation of this mathematical requirement is beyond the scope of this disclosure, and as such will not be discussed in further detail herein. However, it should suffice to state that the requirement of linear independence exists, and that linear independence of the system of equations may be verified using well known and commonly employed mathematical techniques. More particularly, linear independence of the system of simultaneous equations may be insured through careful selection of the feedback coefficients for the convolutional feedback encoder 20. Those skilled in the art will appreciate that sets or libraries of suitable feedback coefficients have been previously calculated and tabulated, and are well known and readily available for implementation in convolutional feedback encoders of the type contemplated herein. It can be shown that a tail-biting circle exists for a given set of feedback coefficients if and only if a(x) and $(1 + x^N)$ are relatively prime, where a(x) is the feedback polynomial and N is the number of bits in the information sequence. If a unique tail-biting circle does not exist, this implies that the matrix A is singular and may not be inverted, i.e., the rows are linearly dependent. This also implies that if a(x) divides $(1 + x^N)$ or if the Hamming weight of a(x) is even, a unique tail-biting circle does not exist for the given set of feedback coefficients. Thus care should be exercised in selecting a feedback polynomial a(x) to ensure that these conditions are satisfied.

Given that a particular set of feedback coefficients is capable of providing a unique tail-biting circle, as discussed above, the next concern becomes actually solving the system of equations and determining the starting state of the encoder 20. The brute force method of finding the starting state of the encoder 20 would be to start the encoder 20 at every possible state and check whether it converges to the same state at the end of the information sequence $\{I\}$. If the starting and ending states are the same, then the tail-biting circle has been found. While this approach is certainly functional, it is not particularly efficient.

Another approach involves solving Equation (10) for the starting state vector s by inverting the matrix A, which results in the following relation:

$$s = A^{-1} d \quad \text{Eq. (14)}$$

where s is a vector whose elements $\{S_{n-1}, \ldots, S_{n-m}\}$. denote the starting state and d is a vector representing the uncoded information sequence $\{I\}$.

The matrix $A^{-1}$ functions as a selection matrix. To find the starting state of the encoder, the information sequence $\{I\}$ represented by the vector d is multiplied by the selection matrix $A^{-1}$. The initial state of the first register element of the encoder 20 is equal to the vector d multiplied by the first row of the selection matrix $A^{-1}$, and the initial state of the $p^{th}$ element is equal to the vector d multiplied by the $p^{th}$ row of the selection matrix $A^{-1}$. The multiplication of the vector d by a row in the selection matrix $A^{-1}$ results in a linear combination of the selected bits in the information sequence $\{I\}$. Thus, each row on the selection matrix $A^{-1}$ represents one linear combination of selected input bits in the information sequence $\{I\}$. These linear combinations represent the starting state of each element 24 in the shift register 22. Thus, the rows of the selection matrix $A^{-1}$ can be thought of as selection vectors for corresponding elements of the shift register 22.

It should be noted that since the same encoder configuration will be used in any communication application over repeated calls, the calculation of the selection matrix $A^{-1}$ need be done only once, and can be performed off-line. Also, it should be noted that only the first m elements of the vector s determine or define the initial state of the shift register 22. Thus, only a subset of the matrix multiplication needs to be performed. All multiplication and addition is modulo 2.

Still another method takes advantage of the circular nature of the matrix A to directly compute the starting state of each shift register element 24 without having to first compute the matrix A. More particularly, this approach assumes that functions p(x) and q(x) exist such that:

$$p(x)a(x)+q(x)(1+x^N)=1 \quad \text{Eq. (15)}$$

where p(x) and q(x) can be found using Euclid's algorithm. Stated another way:

$$p(x)a(x)=1 \bmod (1+x^N) \quad \text{Eq. (16)}$$

Thus, $$x^k p(x)a(x)=x^k \bmod (1+x^N)() \quad \text{Eq. (17)}$$

Therefore, if a matrix P is chosen such that its $l^{th}$ row is given by $x^l p(x)$, then it follows that:

$$PA=I \quad \text{Eq. (18)}$$

where I is the identity matrix, and consequently P must be the inverse of A. With these relationships established, the s vector and hence the starting state of the shift register 22 can be found from the following equation:

$$s_l = \sum_{m=1}^{N}(p_{m+N-1} \bmod N)d_{N-1-m}, l = N-1, \ldots, N-k \quad \text{Eq. (19)}$$

In other words, to find the state of the element $s_{N-l}$ of the encoder 20, first find the vector p(x) by Euclid's algorithm. Euclid's algorithm is described in *Finite Fields for Computer Scientists and Engineers* by Robert J. McEliece published by Kluwer Academic Publishers. The vector p(x) is equal to the first row of the selection matrix $A^{-1}$. Multiply the information sequence {I} by p(x) to obtain the starting state of the first element. For each subsequent element, circularly shift p(x) to the right and multiply by the information sequence {I} to get the starting state.

The encoding method described above can be implemented in a variety of ways. One way to implement the encoding method would be to use a shift register for the input buffer 12. The input buffer 12 would receive the entire input sequence before passing the input sequence to the convolutional feedback encoder 20. A microprocessor or other logic circuit could be used to calculate the starting state of the encoder 20 based upon the contents of the input buffer 12. The microprocessor could use any of the methods described above to calculate the starting state of the encoder 20. After calculating the starting state, the microprocessor would initialize the encoder 20. At that point in time, the bits in the information sequence {I} stored in the input buffer 12 would be clocked into the convolutional feedback encoder 20 for encoding.

Figure 3:
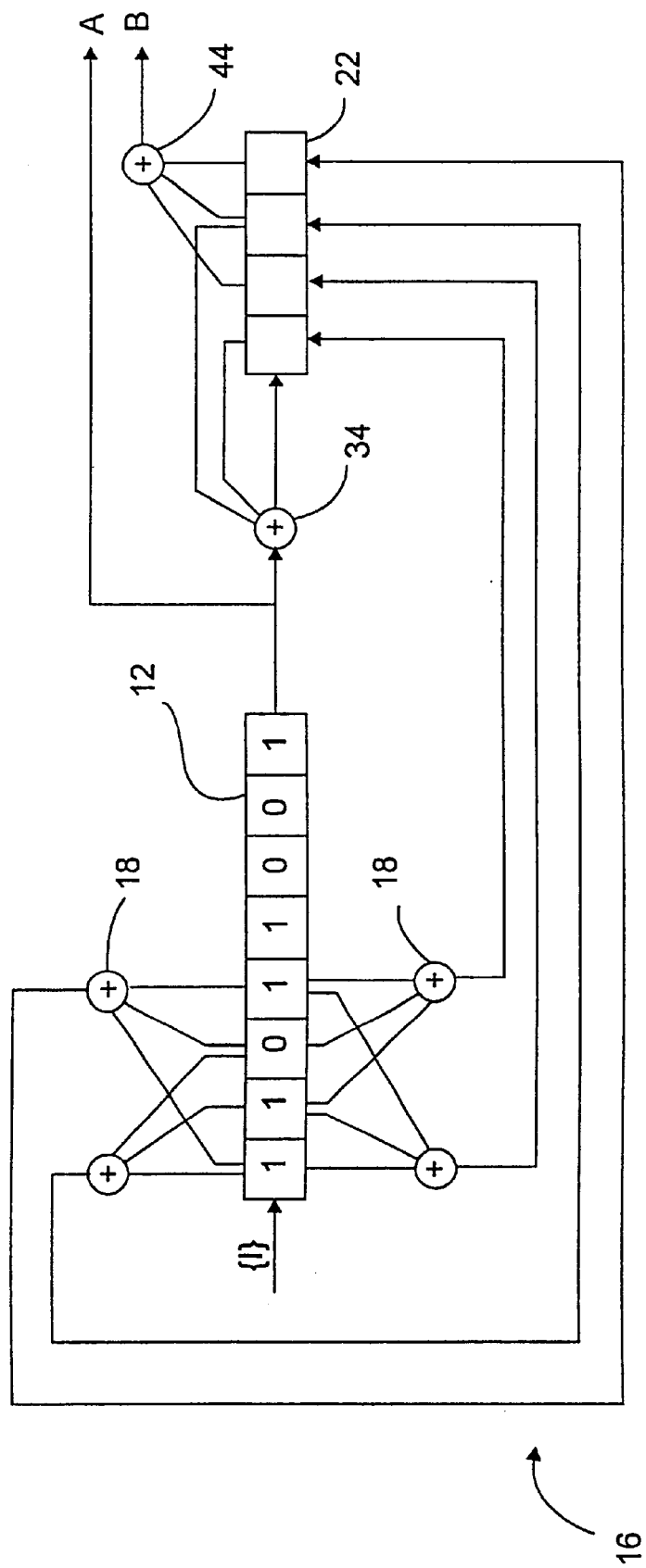
FIG. 3 is a schematic illustration of a logic circuit used in the encoding apparatus of the present invention.

Another implementation uses a linear combining network 16 connected between the input buffer 12 and the shift register 22 of the convolutional feedback encoder 20 to initialize the encoder 20. In this embodiment, which is shown in FIG. 3, the elements of the input buffer 12 are connected in a predetermined fashion to a series of summation nodes 18 which are connected to elements 24 of the shift register 22. The summation nodes 18 form linear combinations of selected bits in the information sequence {I} which are then passed to a respective element 24 in the shift register 22. The linear combining network 16 could be hard-wired. The output of the summation nodes 18 in the linear combining network 16 would be clocked so that the encoder 20 is initialized after the input buffer 12 is filled with a new information sequence {I}.

From the forgoing, it is apparent that the techniques described above to find the starting state of the encoder 20 can be implemented easily using a either a processor or logic circuit. These techniques enable the use of tail-biting codes in recursive convolutional encoders which are useful for encoding relatively short information sequences.

It is to be appreciated that encoders involving multiple bit inputs with multiple shift registers can be treated as encoders with a single multilevel input and a single multilevel arithmetic being performed. Thus, the methods of this application are applicable in these cases also.

The present invention may, of course, be carried out in other specific ways than those herein set forth without departing from the spirit and essential characteristics of the invention. The present embodiments are, therefore, to be considered in all respects as illustrative and not restrictive, and all changes coming within the meaning and equivalency range of the appended claims are intended to be embraced therein.

What is claimed is:

1. An encoding apparatus comprising:
   a. a convolutional feedback encoder for receiving an information sequence comprising a plurality of input bits and producing an encoded output;
   b. an initializing circuit to initialize said convolutional feedback encoder to an initial state selected such that the ending state will be the same as the initial state, wherein said initial state is variable dependent upon said input bits.

2. The encoding apparatus of claim 1 wherein said convolutional feedback encoder comprises a shift register having a plurality of elements wherein the state of the encoder is determined by the contents of the shift register elements.

3. The encoding apparatus of claim 2 wherein said initializing circuit comprises a logic circuit to linearly combine selected bits in said information sequence, wherein linear combinations formed by said logic circuit are used to initialize said elements of said shift register.

4. The encoding apparatus of claim 3 wherein said logic circuit comprises a processor programmed to determine said initial state.

5. The encoding apparatus of claim 3 wherein said logic circuit comprises an input buffer to receive the information sequence and a linear combining network operatively connected between said input buffer and said shift register.

6. The encoding apparatus of claim 5 wherein said input buffer comprises a second shift register.

7. The encoding apparatus of claim 1 wherein said initializing circuit comprises a processor programmed to determine said initial state.

8. A method for encoding an information sequence comprising a plurality of input bits, said encoding method comprising:
   a. inputting said information sequence to a convolutional feedback encoder,
   b. determining the initial state of a convolutional feedback encoder based upon said input bits so that the ending state will be the same as the starting state, c. setting the initial state of said convolutional feedback encoder, and d. encoding said information sequence.

9. The encoding method of claim 8 wherein the initial state of the convolutional feedback encoder is determined by a plurality of linear combinations of input bits in said information sequence.

10. The encoding method of claim 9 further including the step of forming a selection matrix to select input bits in the information sequence to make said linear combinations.

11. The encoding method of claim 10 wherein the selection matrix is the inverse of a matrix A whose first row is given by feedback coefficients of the convolutional feedback encoder and whose subsequent rows are a circular shift of said first row.

12. The encoding method of claim 9 further including the step of forming one or more selection vectors to select input bits in the information sequence to make a linear combination thereof.

13. The encoding method of claim 12 wherein said selection vectors are formed by using Euclid's algorithm to find a first selection vector.

14. An encoding apparatus comprising:

a. a convolutional feedback encoder for receiving an information sequence comprising a plurality of input bits and producing an encoded output;

b. an initializing circuit to initialize said convolutional feedback encoder to initial state selected such that the ending state will be the same as the initial state, wherein said initializing circuit determines said initial state based upon said input bits.

15. The encoding apparatus of claim 14 wherein said initializing circuit comprises a processor programmed to determine said initial state.

16. The encoding apparatus of claim 14 wherein said initializing circuit comprises an input buffer to receive the information sequence and a logic circuit operatively connected to said input buffer.

17. The encoding apparatus of claim 16 wherein said input buffer comprises a shift register.

* * * * *